US011615335B2

(12) United States Patent
Burdick et al.

(10) Patent No.: US 11,615,335 B2
(45) Date of Patent: Mar. 28, 2023

(54) DETECTION SCHEME

(71) Applicant: Quantinuum LLC, Broomfield, CO (US)

(72) Inventors: Nate Burdick, Plymouth, MN (US); Kenny Lee, Denver, CO (US)

(73) Assignee: Quantinuum LLC, Broomfield, CO (US)

( * ) Notice: Subject to any disclaimer, the term of this patent is extended or adjusted under 35 U.S.C. 154(b) by 581 days.

(21) Appl. No.: 16/735,438

(22) Filed: Jan. 6, 2020

(65) Prior Publication Data

US 2020/0272931 A1    Aug. 27, 2020

Related U.S. Application Data

(60) Provisional application No. 62/811,322, filed on Feb. 27, 2019.

(51) Int. Cl.
*G06N 10/00* (2022.01)
*G06N 10/40* (2022.01)
*H01L 39/10* (2006.01)
*H01L 39/12* (2006.01)

(52) U.S. Cl.
CPC ............ *G06N 10/00* (2019.01); *G06N 10/40* (2022.01); *H01L 39/10* (2013.01); *H01L 39/125* (2013.01)

(58) Field of Classification Search
CPC ........ G06N 10/00; G06N 10/40; H01L 39/10; H01L 39/125
See application file for complete search history.

(56) References Cited

U.S. PATENT DOCUMENTS

| 10,733,524 | B1* | 8/2020 | Feig | G06N 10/00 |
| 10,997,522 | B1* | 5/2021 | Hayes | G06N 10/00 |
| 11,004,009 | B2* | 5/2021 | Monroe | G06E 1/00 |
| 11,010,517 | B2* | 5/2021 | Nam | G06F 30/327 |
| 11,150,609 | B1* | 10/2021 | Parazzoli | H01J 49/424 |

OTHER PUBLICATIONS

Quantum control of qubits and atomic motion using ultrafast laser pulses. J. Mizrahi et al. (Year: 2014).*

(Continued)

*Primary Examiner* — Vibol Tan
(74) *Attorney, Agent, or Firm* — Schwegman Lundberg & Woessner, P.A.

(57) ABSTRACT

The present subject matter provides technical solutions for the technical problems facing quantum computing by improving the accuracy and precision of qubit readout. Technical solutions described herein improves the readout fidelity by reducing the ambiguity between the bright and dark states. In an embodiment, this includes transferring the qubit population that is in the dark quantum state to an auxiliary third state. The auxiliary third state remains dark and reduces the mixing between the logical bright and dark states. This process uses multiple laser pulses to ensure high fidelity population transfer, thus preserving the dark nature of the dark state. Improving readout fidelity of 171Yb+ qubits may improve fidelity by an order of magnitude, such as by improving readout fidelity from 99.9% to 99.99%. This improvement in detection fidelity may substantially increase the computational power of a quantum computer.

17 Claims, 5 Drawing Sheets

(56) References Cited

OTHER PUBLICATIONS

Realization of a Quantum Integer-Spin Chain with Controllable Interactions. C. Senko et al. (Year: 2014).*
On the Direct Generation of Ion-Photon Entanglement at Telecom Wavelengths in 171 Yb+. Wance Wang et al. (Year: 2020).*
Demonstration Of Rabi-Flops With Ytterbium 171 Trapped-Ion Qubits. Naleli Matjelo et al. (Year: 2021).*
Dark times in the resonance fluorescence of trapped 171Yb ions caused by spontaneous quantum jumps to the 2 D3/2 (F=2) state. D. Engelke and Chr. Tamm (Year: 1996).*
Scalable hyperfine qubit state detection via electron shelving in the 2D5/2 and 2F7/2 manifolds in 171Yb+. C. L. Edmunds et al. (Year: 2021).*
"European Application Serial No. 20159165.8, Extended European Search Report dated Jul. 22, 2020", 10 pgs.
Gill, P., et al., "Trapped ion optical frequency standards", Measurement Science and Technology, 14(8), (2003), 1174-1186.
Keselman, Anna, et al., "High-fidelity state detection and tomography of a single ion Zeeman qubit", [online]. arXiv:1103.5253 (quant-ph), (Mar. 27, 2011), 18 pgs.
Schacht, M., et al., "71Yb* System Stability, $5D_{3/2}$ Hyperfine State Detection Efficiency and F=2 Lifetime", [online], [retrieved on Jul. 13, 2020]. Retrieved from the Internet: <URL:https://arxiv.org/pdf/1310.2530.pdfs, (Jul. 10, 2018), 26 pgs.
Schneider, Tobias, "Optical Frequency Standard with a Single $^{171}Yb_+$ Ion", [online], [retrieved on Jul. 13, 2020]. Retrieved from the Internet: <URL:https://d-nb.info/977243176/34s, (2005), 108 pgs.
Wright, John, et al., "Scalable Quantum Computing Architecture with Mixed Species Ion Chains", [online], [retrieved on Feb. 8, 2019]. Retrieved from the Internet: <URL:https://arxiv.org/pdf/1410.0037.pdf>, (Sep. 30, 2014), 1-7.
"European Application Serial No. 20159165.8, Response filed Mar. 2, 2021 to Extended European Search Report dated Jul. 22, 2020", 18 pgs.

\* cited by examiner

DETECTION SCHEME

CROSS-REFERENCE TO RELATED APPLICATIONS

This application claims priority to Provisional Patent Application 62/811,322, filed Feb. 27, 2019, the content of which is incorporated herein in its entirety.

TECHNICAL FIELD

Embodiments described herein generally relate to quantum computing.

BACKGROUND

Quantum computing may be used to perform advanced computational processing. Quantum computing may leverage physical properties of quantum bits (e.g., qubits), such as quantum superposition and quantum entanglement. For example, in contrast with conventional digital processing in which data is encoded into binary states (e.g., 1 or 0), quantum superposition enables the qubits used in quantum computing to be in both states simultaneously. In contrast with the independent nature of individual bits in conventional digital processing, quantum entanglement enables a linking between or among qubits so each qubit may provide information about related qubits. However, the fidelity of data encoded into the qubits is subject to errors, such as a spontaneous state change of qubits. What is needed in an improved solution to improve qubit fidelity.

DESCRIPTION OF EMBODIMENTS

The present subject matter provides technical solutions for the technical problems facing quantum computing by improving the accuracy and precision of qubit readout. As used herein, qubit readout refers includes determining which logical state the qubit was in following execution of a particular computation. For ionized ytterbium-171 (i.e., 171Yb+) hyperfine qubits, qubit readout is achieved by identifying a qubit state that emits many photons as "bright" and a qubit state that emits few or no photons as "dark." By collecting photons from the qubit, the state of the qubit can be determined. However, the readout fidelity of 171Yb+ qubits is reduced by mixing of the bright and dark states, which creates ambiguity when determining the state of the qubit. In an embodiment, improving readout fidelity of 171Yb+ qubits may improve fidelity by an order of magnitude, such as by improving readout fidelity from 99.9% to 99.99%. This improvement in detection fidelity may substantially increase the computational power of a quantum computer.

Technical solutions described herein improve the readout fidelity by reducing the ambiguity between the bright and dark states. In an embodiment, this includes transferring the qubit population that is in the dark quantum state to an auxiliary third state. The auxiliary third state remains dark and reduces the mixing between the logical bright and dark states. This process uses multiple laser pulses to ensure high fidelity population transfer, thus preserving the dark nature of the dark state during readout. This transfer to an auxiliary third state may be referred to as "shelving." While 171Yb+ qubits offer various advantages described herein, the atomic structure of 171Yb+ qubits may be considered unfavorable for shelving. However, using the controlled state transitions described herein, shelving 171Yb+ qubits may provide improved readout fidelity.

The following description and the drawings sufficiently illustrate specific embodiments to enable those skilled in the art to understand the specific embodiment. Other embodiments may incorporate structural, logical, electrical, process, and other changes. Portions and features of various embodiments may be included in, or substituted for, those of other embodiments. Embodiments set forth in the claims encompass all available equivalents of those claims.

Figure 1:
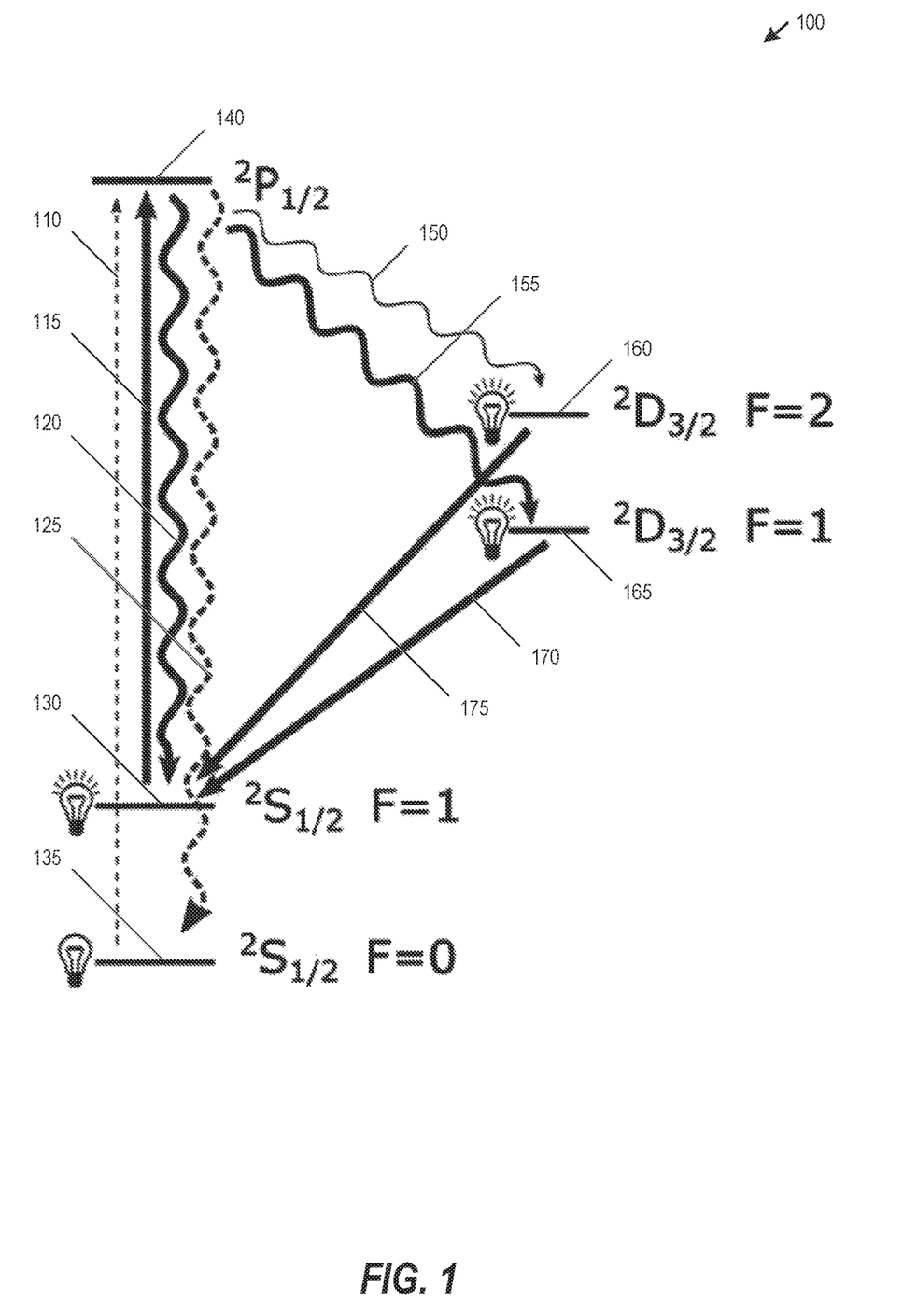
FIG. 1 is a first 171Yb+ state transition diagram, according to an embodiment.

FIG. 1 is a first 171Yb+ state transition diagram 100, according to an embodiment. Diagram 100 shows various 171Yb+ states and state transitions. As shown in diagram 100, straight lines indicate transitions at least partially driven by lasers, wavy lines indicate decay transitions, transition line thickness indicates transition strength, dashed lines indicate undesired transitions that are detrimental to detection, and solid lines are desirable or inconsequential transitions in state detection.

Laser transition 110 may include a laser applied to transition states from a dark S-state 135 to a P-state 140, which may be detrimental to detection. Laser transition 115 may include a laser applied to transition states from a bright S-state 130 to the P-state 140, which may be beneficial in state detection. Decay transition 120 may include a spontaneous 171Yb+ state decay from P-state 140 to bright S-state 130, which may be beneficial in state detection. Decay transition 125 may include a spontaneous 171Yb+ state decay from P-state 140 to dark S-state 135, which may be detrimental in state detection. Light is collected from the decay transition 120. The decay transition 125 is undesirable, and may typically occur after approximately 3 ms. The laser transition 110 is also undesirable, and may typically occur after approximately 52 ms.

Decay transition 150 may include a spontaneous 171Yb+ state decay from P-state 140 to bright D-state 160, which may be inconsequential in state detection. Decay transition 155 may include a spontaneous 171Yb+ state decay from P-state 140 to dark D-state 165, which may be inconsequential in state detection. Laser transition 170 may include a laser applied to transition states from a bright D-state 165 (e.g., through an unshown intermediary state such as $^2[3/2]_{1/2}$) to bright S-state 130, which may be beneficial in state detection. Laser transition 175 may include a laser applied to transition states from bright D-state 160 (e.g., through an unshown intermediary state such as $^2[3/2]_{1/2}$) to bright S-state 130, which may be beneficial in state detection. Both decay transition 150 and decay transition 155 are both returned to bright S-state 130, and may be considered inconsequential for state detection.

Figure 2:
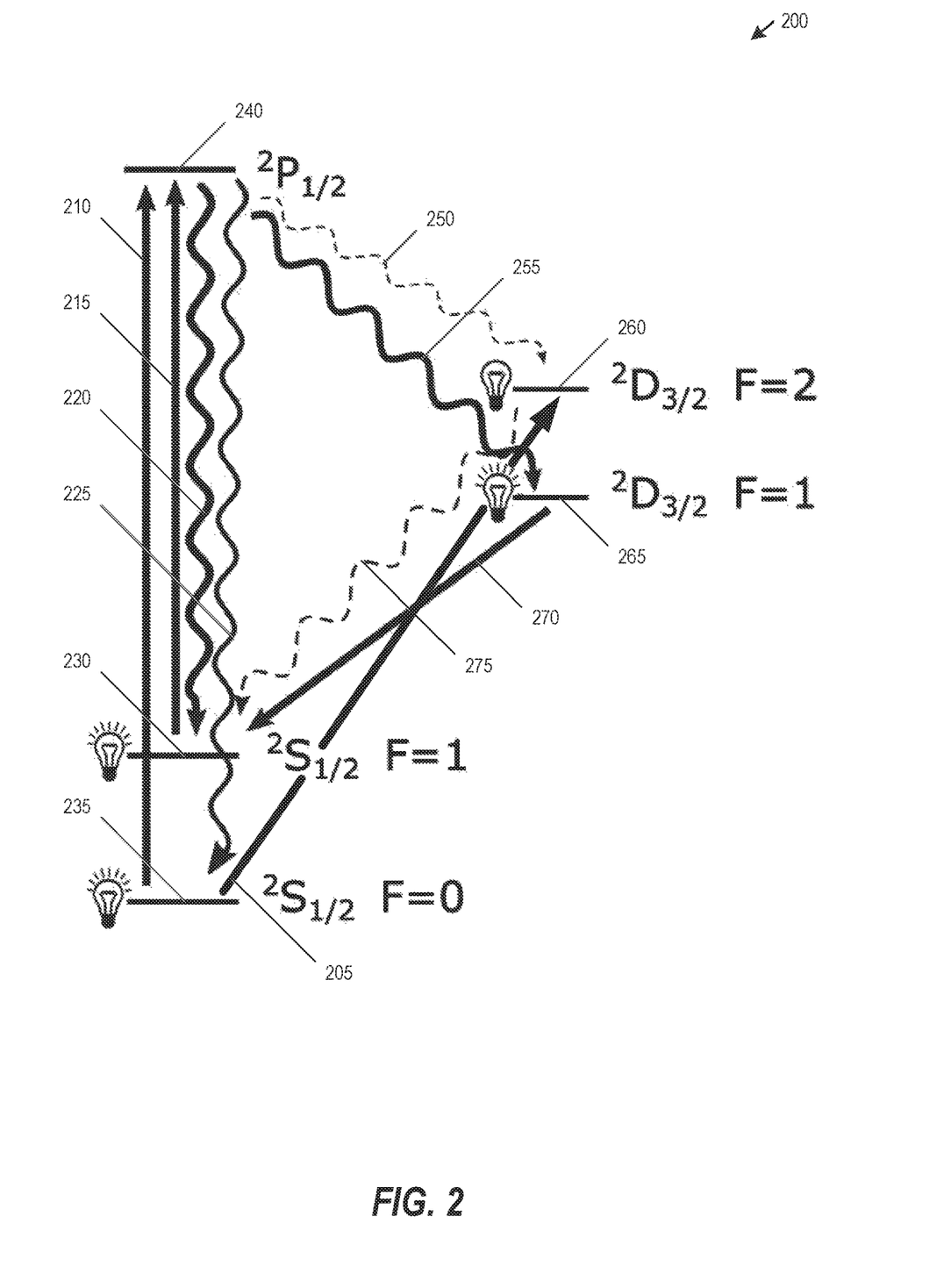
FIG. 2 is a second 171Yb+ state transition diagram, according to an embodiment.

FIG. 2 is a second 171Yb+ state transition diagram 200, according to an embodiment. This second 171Yb+ state transition diagram 200 is similar to diagram 100 with a few notable differences. In diagram 200, laser transitions 205 between S-state 235 and D-state 260 are used before collecting light (e.g., detecting bright or dark state) to transfer any 171Yb+ ions from S-state 235 to dark D-state 260. Light is collected from decay transitions 220 and 225 from P-state 240 to dark S-states 230 and 235. For any 171Yb+ ions that decay from P-state 240 to dark S-state 235, laser transition 210 is used to transition the ions back from dark S-state 235 to P-state 240. The decay transition 275 from dark D-state 260 to bright S-state 230 is undesirable and may occur after approximately 53 ms. Similarly, the decay transition 250 from P-state 240 to dark D-state 260 is undesirable and may occur after approximately 100 ms. However, both of these undesirable state transitions are substantially slower than the 3 ms decay transition 125 in diagram 100. The laser and decay transitions shown in diagram 200 thus increases bright state lifetime by allowing 14.7 GHz sidebands and provides fast and efficient repump with no additional laser overhead.

Figure 3:
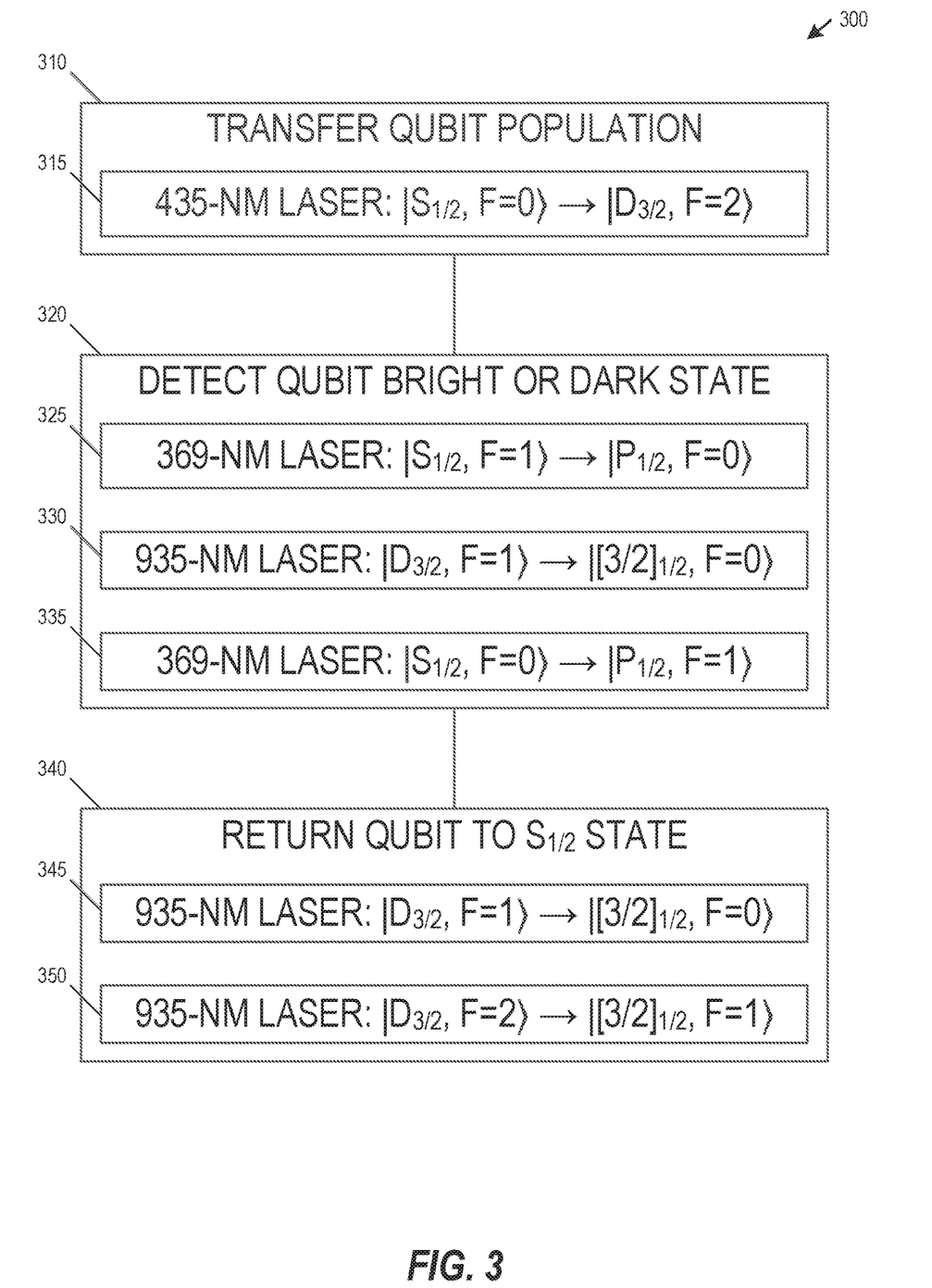
FIG. 3 is a 171Yb+ state transition method, according to an embodiment.

FIG. 3 is a 171Yb+ state transition method 300, according to an embodiment. Method 300 includes transferring 310 qubit population, where a 435-nm laser is used to transfer 315 qubit population in the $|S_{1/2}, F=0\rangle$ state to the $|D_{3/2}, F=2\rangle$ manifold of states. In an embodiment, transfer 315 is carried out via two consecutive laser pulses that are tuned to selectively populate the $|D_{3/2}, F=2, mF=\pm2\rangle$ hyperfine levels. In an embodiment, the application of the second laser pulse increases the efficiency of transfer 315 approximately an order of magnitude, whereas a third pulse would not substantially increase the efficiency of transfer 315 beyond the use of two pulses.

Method 300 includes detecting 320 qubit bright or dark state, where three lasers are used to check if the qubit is in the bright or the dark state. First detection laser 325 includes a 369-nm laser connecting $|S_{1/2}, F=1\rangle$ to $|P_{1/2}, F=0\rangle$. Second detection laser 330 includes a 935-nm laser connecting $|D_{3/2}, F=1\rangle$ to $|[3/2]_{1/2}, F=0\rangle$. Third detection laser 335 includes a 369-nm laser connecting $|S_{1/2}, F=0\rangle$ to $|P_{1/2}, F=1\rangle$.

Method 300 includes returning 340 any 171Yb+ qubit in the $D_{3/2}$ state to the $S_{1/2}$ state. First return laser 345 includes a 935-nm laser connecting $|D_{3/2}, F=1\rangle$ to $|[3/2]_{1/2}, F=0\rangle$. Second return laser 350 includes a 935-nm laser connecting $|D_{3/2}, F=2\rangle$ to $|[3/2]_{1/2}, F=1\rangle$.

Figure 4A:
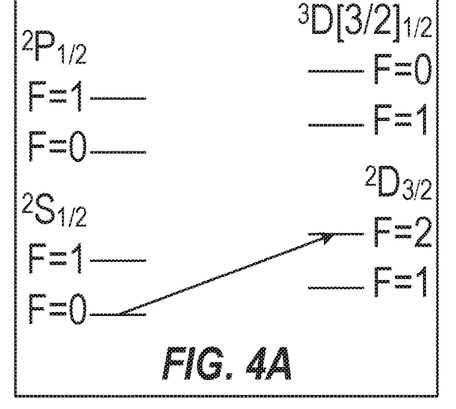
FIGS. 4A-4F are 171Yb+ states, according to an embodiment.

FIGS. 4A-4F are 171Yb+ states 400, according to an embodiment. 171Yb+ states 400 result from particular steps within method 300. FIG. 4A depicts transferring 310 qubit population, where the 435-nm laser is used to transfer 315 qubit population from the $|S_{1/2}, F=0\rangle$ state to the $|D_{3/2}, F=2\rangle$ manifold of states. In an embodiment, transfer 315 shown in FIG. 4A is carried out via two consecutive laser pulses that are tuned to selectively populate the $|D_{3/2}, F=2, mF=\pm2\rangle$ hyperfine levels.

Figure 4B:
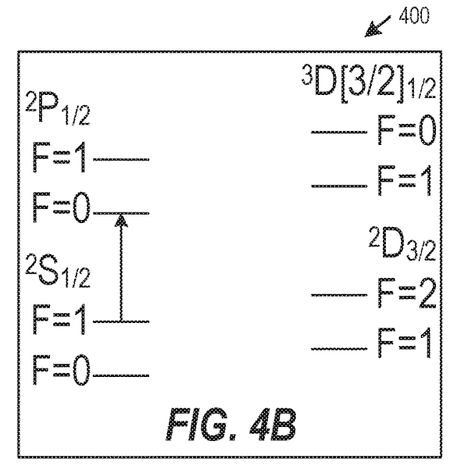
Figure 4C:
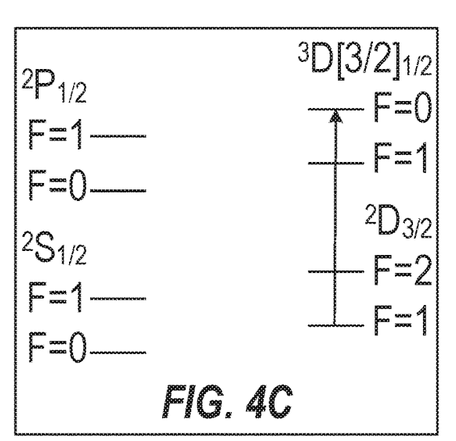
Figure 4D:
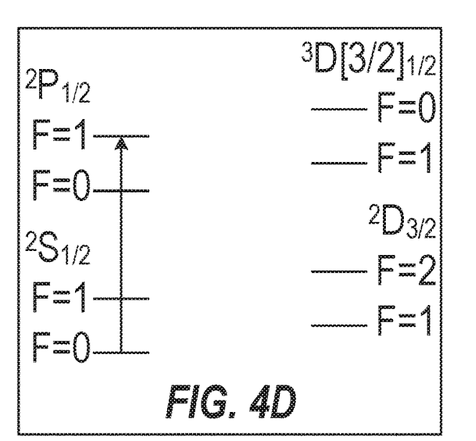

FIGS. 4B-4D show detecting 320 qubit bright or dark state. FIG. 4B shows first detection laser 325 that connects $|S_{1/2}, F=1\rangle$ to $|P_{1/2}, F=0\rangle$. FIG. 4C shows second detection laser 330 that connects $|D_{3/2}, F=1\rangle$ to $|[3/2]_{1/2}, F=0\rangle$. FIG. 4D shows third detection laser 335 that connects $|S_{1/2}, F=0\rangle$ to $|P_{1/2}, F=1\rangle$.

Figure 4E:
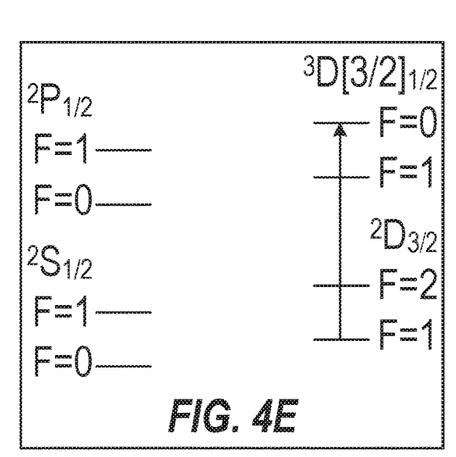
Figure 4F:
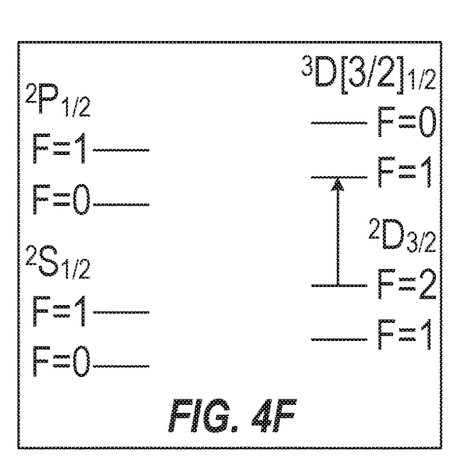

FIGS. 4E-4F show returning 340 any 171Yb+ qubit in the $D_{3/2}$ state to the $S_{1/2}$ state. FIG. 4E shows first return laser 345 connecting $|D_{3/2}, F=1\rangle$ to $|[3/2]_{1/2}, F=0\rangle$. FIG. 4F shows second return laser 350 connecting $|D_{3/2}, F=2\rangle$ to $|[3/2]_{1/2}, F=1\rangle$.

Figure 5:
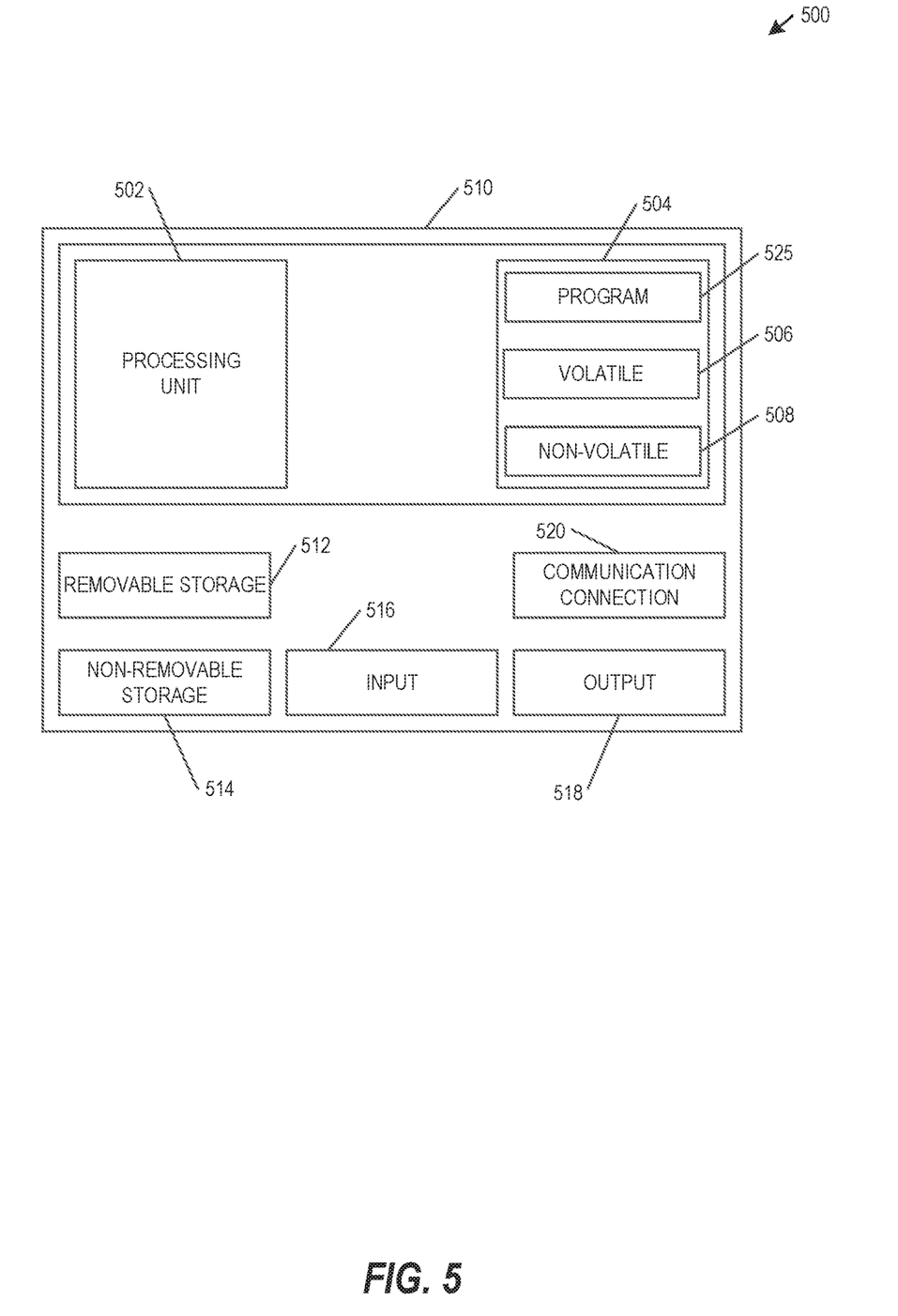
FIG. 5 is a block schematic diagram of a computer system to implement ytterbium shelving detection, according to an example embodiment.

FIG. 5 is a block schematic diagram of a computer system 500 to implement ytterbium shelving detection, according to an example embodiment. The computer system 500 may utilize fewer components than shown in FIG. 5 in some embodiments to perform the methods described. One example computing device in the form of a computer 500, may include a processing unit 502, memory 503, removable storage 510, and non-removable storage 512. Memory 503 may include volatile memory 514 and non-volatile memory 508. Computer 500 may include or have access to a computing environment that includes—a variety of computer-readable media, such as volatile memory 514 and non-volatile memory 508, removable storage 510 and non-removable storage 512. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices, or any other medium capable of storing computer-readable instructions. Computer 500 may include or have access to a computing environment that includes input 506, output 504, and a communication connection 516. The computer may operate in a networked environment using a communication connection to connect to one or more remote computers, such as database servers. The remote computer may include a personal computer (PC), server, router, network PC, a peer device or other common network node, or the like. The communication connection may include a Local Area Network (LAN), a Wide Area Network (WAN) or other networks.

Computer-readable instructions stored on a computer-readable medium are executable by the processing unit 502 of the computer 500. A hard drive, CD-ROM, and RAM are some examples of articles including a non-transitory computer-readable medium. For example, a computer program 518 capable of providing a generic technique to perform access control check for data access and/or for doing an operation on one of the servers in a component object model (COM) based system may be included on a CD-ROM and loaded from the CD-ROM to a hard drive. The computer-readable instructions allow computer 500 to provide generic access controls in a COM based computer network system having multiple users and servers.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

Example 1 is a quantum computing state detection system comprising: a shelving laser to transfer an ytterbium-171 ion from an initial state to a shelved state; a plurality of detection lasers to detect a present state of the ion; and a plurality of return lasers to return the ion to an initialized state.

In Example 2, the subject matter of Example 1 optionally includes application of a 435-nm laser to transfer the ion from a $|S_{1/2}, F=0\rangle$ state to a $|D_{3/2}, F=2\rangle$ manifold state.

In Example 3, the subject matter of any one or more of Examples 1-2 optionally include wherein the shelving laser transfer of the ion from the initial state to the shelved state includes application of two 435-nm laser pulses.

In Example 4, the subject matter of any one or more of Examples 1-3 optionally include wherein the shelving laser further transfers an ion population from the initial state to the shelved state.

In Example 5, the subject matter of Example 4 optionally includes wherein the ion population includes a plurality of ytterbium-171 ions.

In Example 6, the subject matter of any one or more of Examples 1-5 optionally include wherein the detection of the present state includes: application of a 369-nm laser pulse connecting a $|S_{1/2}, F=1\rangle$ state to a $|P_{1/2}, F=0\rangle$ state; application of a 935-nm laser connecting a $|D_{3/2}, F=1\rangle$ state to a $|[3/2]_{1/2}, F=0\rangle$ state; and application of a 369-nm laser connecting a $|S_{1/2}, F=0\rangle$ state to a $|P_{1/2}, F=1\rangle$ state.

In Example 7, the subject matter of any one or more of Examples 1-6 optionally include wherein the return of the ion to the initialized state includes: application of a 935-nm laser connecting a $|D3/2, F=1\rangle$ to a $|[3/2] \frac{1}{2}, F=0\rangle$ state; and application of a 935-nm laser connecting a $|D3/2, F=2\rangle$ state to a $|[3/2] \frac{1}{2}, F=1\rangle$ state.

Example 8 is a quantum computing state detection method comprising: transferring an ytterbium-171 ion from an initial state to a shelved state; detecting a present state of the ion; and returning the ion to the initialized state.

In Example 9, the subject matter of Example 8 optionally includes wherein transferring the ion includes applying a 435-nm laser to transfer the ion from a $|S_{1/2}, F=0\rangle$ state to a $|D_{3/2}, F=2\rangle$ manifold state.

In Example 10, the subject matter of any one or more of Examples 8-9 optionally include wherein transferring the ion from the initial state to the shelved state includes applying two 435-nm laser pulses.

In Example 11, the subject matter of any one or more of Examples 8-10 optionally include wherein transferring the ion includes transferring an ion population from the initial state to the shelved state.

In Example 12, the subject matter of Example 11 optionally includes wherein the ion population includes a plurality of ytterbium-171 ions.

In Example 13, the subject matter of any one or more of Examples 8-12 optionally include wherein detecting the present state includes: applying a 369-nm laser pulse connecting a $|S_{1/2}, F=1\rangle$ state to a $|P_{1/2}, F=0\rangle$ state; applying a 935-nm laser connecting a $|D_{3/2}, F=1\rangle$ state to a $|[3/2]_{1/2}, F=0\rangle$ state; and applying a 369-nm laser connecting a $|S_{1/2}, F=0\rangle$ state to a $|P_{1/2}, F=1\rangle$ state.

In Example 14, the subject matter of any one or more of Examples 8-13 optionally include wherein returning the ion includes: applying a 935-nm laser connecting a $|D_{3/2}, F=1\rangle$ to a $|[3/2]_{1/2}, F=0\rangle$ state; and applying a 935-nm laser connecting a $|D_{3/2}, F=2\rangle$ state to a $|[3/2]_{1/2}, F=1\rangle$ state.

Example 15 is one or more machine-readable medium including instructions, which when executed by a computing system, cause the computing system to perform any of the methods of Examples 8-14.

Example 16 is an apparatus comprising means for performing any of the methods of Examples 8-14.

Example 17 is a machine-readable storage medium comprising a plurality of instructions that, when executed with a processor of a device, cause the device to: transfer an ytterbium-171 ion from an initial state to a shelved state; detect a present state of the ion; and return the ion to the initialized state.

In Example 18, the subject matter of Example 17 optionally includes wherein transferring the ion includes applying a 435-nm laser to transfer the ion from a $|S_{1/2}, F=0\rangle$ state to a $|D_{3/2}, F=2\rangle$ manifold state.

In Example 19, the subject matter of any one or more of Examples 17-18 optionally include wherein transferring the ion from the initial state to the shelved state includes applying two 435-nm laser pulses.

In Example 20, the subject matter of any one or more of Examples 17-19 optionally include wherein transferring the ion includes transferring an ion population from the initial state to the shelved state, the ion population including a plurality of ytterbium-171 ions.

In Example 21, the subject matter of any one or more of Examples 17-20 optionally include wherein detecting the present state includes: applying a 369-nm laser pulse connecting a $|S_{1/2}, F=1\rangle$ state to a $|P_{1/2}, F=0\rangle$ state; applying a 935-nm laser connecting a $|D_{3/2}, F=1\rangle$ state to a $|[3/2]_{1/2}, F=0\rangle$ state; and applying a 369-nm laser connecting a $|S_{1/2}, F=0\rangle$ state to a $|P_{1/2}, F=1\rangle$ state.

In Example 22, the subject matter of any one or more of Examples 17-21 optionally include wherein returning the ion includes: applying a 935-nm laser connecting a $|D_{3/2}, F=1\rangle$ to a $|[3/2]_{1/2}, F=0\rangle$ state; and applying a 935-nm laser connecting a $|D_{3/2}, F=2\rangle$ state to a $|[3/2]_{1/2}, F=1\rangle$ state.

Example 23 is a quantum computing state detection apparatus comprising: means for transferring an ytterbium-171 ion from an initial state to a shelved state; means for detecting a present state of the ion; and means for returning the ion to the initialized state.

In Example 24, the subject matter of Example 23 optionally includes wherein transferring the ion includes means for applying a 435-nm laser to transfer the ion from a $|S_{1/2}, F=0\rangle$ state to a $|D_{3/2}, F=2\rangle$ manifold state.

In Example 25, the subject matter of any one or more of Examples 23-24 optionally include wherein means for transferring the ion from the initial state to the shelved state includes means for applying two 435-nm laser pulses.

In Example 26, the subject matter of any one or more of Examples 23-25 optionally include wherein means for transferring the ion includes means for transferring an ion population from the initial state to the shelved state.

In Example 27, the subject matter of Example 26 optionally include wherein the ion population including a plurality of ytterbium-171 ions.

In Example 28, the subject matter of any one or more of Examples 23-27 optionally include wherein means for detecting the present state includes: means for applying a 369-nm laser pulse connecting a $|S_{1/2}, F=1\rangle$ state to a $|P_{1/2}, F=0\rangle$ state; means for applying a 935-nm laser connecting a $|D_{3/2}, F=1\rangle$ state to a $|[3/2]_{1/2}, F=0\rangle$ state; and means for applying a 369-nm laser connecting a $|S_{1/2}, F=0\rangle$ state to a $|P_{1/2}, F=1\rangle$ state.

In Example 29, the subject matter of any one or more of Examples 23-28 optionally include wherein means for returning the ion includes: means for applying a 935-nm laser connecting a $|D_{3/2}, F=1\rangle$ to a $\beta[3/2]_{1/2}, F=0\rangle$ state; and means for applying a 935-nm laser connecting a $|D_{3/2}, F=2\rangle$ state to a $|[3/2]_{1/2}, F=1\rangle$ state.

Example 30 is one or more machine-readable medium including instructions, which when executed by a machine, cause the machine to perform operations of any of the operations of Examples 1-29.

Example 31 is an apparatus comprising means for performing any of the operations of Examples 1-29.

Example 32 is a system to perform the operations of any of the Examples 1-29.

Example 33 is a method to perform the operations of any of the Examples 1-29.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. In the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope should be determined with reference to the appended claims, along with the full scope of equivalents to which such claims are entitled.

What is claimed is:

1. A quantum computing state detection system comprising:
    a shelving laser to transfer an ytterbium-171 ion from an initial state to a shelved state, wherein the shelving laser transfer of the ion from the initial state to the shelved state includes application of two 435-nm laser pulses;
    a plurality of detection lasers to detect a present state of the ion; and
    a plurality of return lasers to return the ion to an initialized state.

2. The system of claim 1, wherein the shelving laser includes application of a 435-nm laser to transfer the ion from a $|S_{1/2}, F=0\rangle$ state to a $|D_{3/2}, F=2\rangle$ manifold state.

3. The system of claim 1, wherein the shelving laser further transfers an ion population from the initial state to the shelved state.

4. The system of claim 3, wherein the ion population includes a plurality of ytterbium-171 ions.

5. The system of claim 1, wherein the detection of the present state includes:
    application of a 369-nm laser pulse connecting a $|S_{1/2}, F=1\rangle$ state to a $|P_{1/2}, F=0\rangle$ state;
    application of a 935-nm laser connecting a $|D_{3/2}, F=1\rangle$ state to a $|[3/2]_{1/2}, F=0\rangle$ state; and
    application of a 369-nm laser connecting a $|S_{1/2}, F=0\rangle$ state to a $|P_{1/2}, F=1\rangle$ state.

6. The system of claim 1, wherein the return of the ion to the initialized state includes:
    application of a 935-nm laser connecting a $|D_{3/2}, F=1\rangle$ to a $|[3/2]_{1/2}, F=0\rangle$ state; and
    application of a 935-nm laser connecting a $|D_{3/2}, F=2\rangle$ state to a $|[3/2]_{1/2}, F=1\rangle$ state.

7. A quantum computing state detection method comprising:
    transferring an ytterbium-171 ion from an initial state to a shelved state, wherein transferring the ion from the initial state to the shelved state includes applying two 435-nm laser pulses;
    detecting a present state of the ion; and
    returning the ion to an initialized state.

8. The method of claim 7, wherein transferring the ion includes applying a 435-nm laser to transfer the ion from a $|S_{1/2}, F=0\rangle$ state to a $|D_{3/2}, F=2\rangle$ manifold state.

9. The method of claim 7, wherein transferring the ion includes transferring an ion population from the initial state to the shelved state.

10. The method of claim 9, wherein the ion population includes a plurality of ytterbium-171 ions.

11. The method of claim 7, wherein detecting the present state includes:
    application of a 369-nm laser pulse connecting a $|S_{1/2}, F=1\rangle$ state to a $|P_{1/2}, F=0\rangle$ state;
    application of a 935-nm laser connecting a $|D_{3/2}, F=1\rangle$ state to a $|[3/2]_{1/2}, F=0\rangle$ state; and
    application of a 369-nm laser connecting a $|S_{1/2}, F=0\rangle$ state to a $|P_{1/2}, F=1\rangle$ state.

12. The method of claim 7, wherein returning the ion includes:
    application of a 935-nm laser connecting a $|D_{3/2}, F=1\rangle$ to a $|[3/2]_{1/2}, F=0\rangle$ state; and
    application of a 935-nm laser connecting a $|D_{3/2}, F=2\rangle$ state to a $|[3/2]_{1/2}, F=1\rangle$ state.

13. A non-transitory machine-readable storage medium comprising a plurality of instructions that, when executed with a processor of a device, cause the device to:
    transfer an ytterbium-171 ion from an initial state to a shelved state, wherein transferring the ion from the initial state to the shelved state includes applying two 435-nm laser pulses;
    detect a present state of the ion; and
    return the ion to an initialized state.

14. The non-transitory machine-readable storage medium of claim 13, wherein transferring the ion includes applying a 435-nm laser to transfer the ion from a $|S_{1/2}, F=0\rangle$ state to a $D_{3/2}, F=2\rangle$ manifold state.

15. The non-transitory machine-readable storage medium of claim 13, wherein transferring the ion includes transferring an ion population from the initial state to the shelved state, the ion population including a plurality of ytterbium-171 ions.

16. The non-transitory machine-readable storage medium of claim 13, wherein detecting the present state includes:
    application of a 369-nm laser pulse connecting a $|S_{1/2}, F=1\rangle$ state to a $|P_{1/2}, F=0\rangle$ state;
    application of a 935-nm laser connecting a $|D_{3/2}, F=1\rangle$ state to a $|[3/2]_{1/2}, F=0\rangle$ state; and
    application of a 369-nm laser connecting a $|S_{1/2}, F=0\rangle$ state to a $|P_{1/2}, F=1\rangle$ state.

17. The non-transitory machine-readable storage medium of claim 13, wherein returning the ion includes:
- application of a 935-nm laser connecting a $|D_{3/2}, F=1\rangle$ to a $|[3/2]_{1/2}, F=0\rangle$ state; and
- application of a 935-nm laser connecting a $|D_{3/2}, F=2\rangle$ state to a $|[3/2]_{1/2}, F=1\rangle$ state.

\* \* \* \* \*